United States Patent
Tomikawa et al.

(10) Patent No.: US 9,743,534 B2
(45) Date of Patent: Aug. 22, 2017

(54) WIRING BOARD WITH BUILT-IN ELECTRONIC COMPONENT AND METHOD FOR MANUFACTURING THE SAME

(71) Applicant: IBIDEN CO., LTD., Ogaki (JP)

(72) Inventors: Mitsuhiro Tomikawa, Ogaki (JP); Kota Noda, Ogaki (JP); Nobuhisa Kuroda, Ogaki (JP); Haruhiko Morita, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 13 days.

(21) Appl. No.: 14/878,072

(22) Filed: Oct. 8, 2015

(65) Prior Publication Data

US 2016/0105966 A1  Apr. 14, 2016

(30) Foreign Application Priority Data

Oct. 8, 2014  (JP) .................................. 2014-207433

(51) Int. Cl.
*H05K 1/03* (2006.01)
*H05K 3/46* (2006.01)
(Continued)

(52) U.S. Cl.
CPC ........... *H05K 3/4697* (2013.01); *H05K 1/185* (2013.01); *H01L 2224/16227* (2013.01);
(Continued)

(58) Field of Classification Search
CPC ... H05K 1/02; H05K 1/11; H05K 1/16; H05K 1/18; H05K 3/00; H05K 3/10; H05K 3/30; H05K 3/38; H05K 7/00; H05K 7/06; H05K 7/44; H05K 7/46; H01L 21/02; H01L 21/04; H01L 21/20; H01L 21/44; H01L 23/02;
(Continued)

(56) References Cited

U.S. PATENT DOCUMENTS 6,226,169 B1 *  5/2001  Naito .................. H01G 4/01
                                         361/303
6,292,350 B1 *  9/2001  Naito .................. H01G 4/012
                                         361/303

(Continued)

FOREIGN PATENT DOCUMENTS

JP  2009-004734 A  1/2009

*Primary Examiner* — Xiaoliang Chen
(74) *Attorney, Agent, or Firm* — Oblon, McClelland, Maier & Neustadt, L.L.P.

(57) ABSTRACT

A wiring board with a built-in electronic component includes a substrate having cavity, an insulating layer formed on the substrate such that the insulating layer is covering the cavity, a conductor layer formed on the insulating layer, and an electronic component accommodated in the cavity and including a rectangular cuboid body and terminal electrodes such that each electrode has a metal film form formed on outer surface of the body, and via conductors formed in the insulating layer such that the via conductors are connecting the conductor layer and electrodes. The electrodes are arrayed in a matrix having rows and columns such that adjacent electrodes in row and column directions have the opposite polarities, and the conductor layer includes a line pattern shunting first group of the electrodes in one polarity and a solid pattern shunting second group of the electrodes in the other polarity.

20 Claims, 13 Drawing Sheets

(51) Int. Cl.
*H05K 1/18* (2006.01)
*H05K 1/14* (2006.01)
*H05K 3/00* (2006.01)
*H05K 3/42* (2006.01)

(52) U.S. Cl.
CPC .............. *H01L 2224/16265* (2013.01); *H01L 2224/48091* (2013.01); *H01L 2224/48227* (2013.01); *H01L 2224/73265* (2013.01); *H01L 2225/1023* (2013.01); *H01L 2225/1058* (2013.01); *H01L 2924/15311* (2013.01); *H01L 2924/15331* (2013.01); *H05K 1/141* (2013.01); *H05K 3/0038* (2013.01); *H05K 3/427* (2013.01); *H05K 3/4602* (2013.01); *H05K 3/4644* (2013.01); *H05K 2201/10015* (2013.01); *H05K 2203/1476* (2013.01)

(58) Field of Classification Search
CPC ......... H01L 23/04; H01L 23/12; H01L 23/48; H01L 23/58; H01G 4/05; H01G 4/06; H01G 4/12; H01G 4/30; H01G 4/228; B32B 38/00; B32B 38/10
USPC ....... 174/255, 251, 257, 258, 260–262, 265, 174/266; 361/272, 303, 306.1, 306.2, 361/306.3, 311, 728, 760, 761, 763, 782; 257/532, 678, 698, 700, 773; 156/89.12, 156/280, 293, 272.6, 247; 29/832, 834, 29/837, 841, 846
See application file for complete search history.

(56) References Cited

U.S. PATENT DOCUMENTS

| | | | | |
|---|---|---|---|---|
| 6,370,010 B1* | 4/2002 | Kuroda | H01G 4/232 | 361/303 |
| 6,370,013 B1* | 4/2002 | Iino | H01G 4/2325 | 257/E23.062 |
| 6,388,207 B1* | 5/2002 | Figueroa | H01L 23/49805 | 174/261 |
| 6,724,638 B1* | 4/2004 | Inagaki | H01L 21/4857 | 257/E23.062 |
| 6,876,554 B1* | 4/2005 | Inagaki | H01G 4/224 | 257/E23.062 |
| 6,956,730 B2* | 10/2005 | Togashi | H01G 4/30 | 361/306.3 |
| 7,688,568 B1* | 3/2010 | Lee | H01G 4/232 | 361/303 |
| 7,821,795 B2* | 10/2010 | Sugaya | H01L 23/3128 | 361/523 |
| 2002/0011351 A1* | 1/2002 | Ogawa | H01L 21/4803 | 174/260 |
| 2002/0159243 A1* | 10/2002 | Ogawa | H01L 23/49822 | 361/760 |
| 2004/0179325 A1* | 9/2004 | Togashi | H01G 4/012 | 361/306.3 |
| 2004/0256731 A1* | 12/2004 | Mao | C08L 65/00 | 257/773 |
| 2006/0003495 A1* | 1/2006 | Sunohara | H01L 21/4857 | 438/124 |
| 2006/0145331 A1* | 7/2006 | Cho | H01L 24/18 | 257/700 |
| 2006/0157832 A1* | 7/2006 | Ryu | H01L 23/5389 | 257/678 |
| 2007/0045814 A1* | 3/2007 | Yamamoto | H01G 4/236 | 257/698 |
| 2007/0045815 A1* | 3/2007 | Urashima | H05K 1/0231 | 257/698 |
| 2007/0064375 A1* | 3/2007 | Urashima | H01G 2/06 | 361/311 |
| 2007/0076392 A1* | 4/2007 | Urashima | H01G 2/06 | 361/763 |
| 2007/0117338 A1* | 5/2007 | Yamamoto | H01G 4/232 | 438/396 |
| 2007/0121273 A1* | 5/2007 | Yamamoto | H01G 4/232 | 361/306.2 |
| 2007/0121275 A1* | 5/2007 | Takashima | H01G 4/385 | 361/311 |
| 2007/0263364 A1* | 11/2007 | Kawabe | H01L 23/49822 | 361/728 |
| 2007/0281394 A1* | 12/2007 | Kawabe | H01L 21/4857 | 438/118 |
| 2008/0074826 A1* | 3/2008 | Lee | H01G 4/232 | 361/306.3 |
| 2008/0149384 A1* | 6/2008 | Kawabe | H01L 23/49822 | 174/265 |
| 2008/0186652 A1* | 8/2008 | Lee | H01G 4/012 | 361/306.3 |
| 2008/0239685 A1* | 10/2008 | Kawabe | H01G 4/232 | 361/782 |
| 2008/0277150 A1* | 11/2008 | Takashima | H01L 21/4857 | 174/260 |
| 2009/0059469 A1* | 3/2009 | Lee | H01G 4/012 | 361/306.2 |
| 2009/0205202 A1* | 8/2009 | Tanaka | H01L 24/82 | 29/834 |
| 2009/0205859 A1* | 8/2009 | Tanaka | H01L 24/18 | 174/260 |
| 2010/0095498 A1* | 4/2010 | Aoki | H01G 4/012 | 29/25.42 |
| 2010/0163168 A1* | 7/2010 | Saita | H01L 21/4857 | 156/247 |
| 2010/0163172 A1* | 7/2010 | Saita | B32B 38/0008 | 156/272.6 |
| 2010/0163290 A1* | 7/2010 | Nagata | B32B 37/025 | 174/260 |
| 2010/0300602 A1* | 12/2010 | Ichiyanagi | H01G 4/232 | 156/89.12 |
| 2010/0300740 A1* | 12/2010 | Ichiyanagi | H01G 4/232 | 174/260 |
| 2011/0018099 A1* | 1/2011 | Muramatsu | H01L 21/4857 | 257/532 |
| 2011/0085277 A1* | 4/2011 | Hur | H01G 4/005 | 361/272 |
| 2012/0080222 A1* | 4/2012 | Kim | H05K 1/0231 | 174/260 |
| 2012/0186866 A1* | 7/2012 | Mikado | H05K 1/185 | 174/260 |
| 2012/0188734 A1* | 7/2012 | Mikado | H05K 1/185 | 361/761 |
| 2012/0212919 A1* | 8/2012 | Mano | H05K 1/185 | 361/782 |
| 2013/0048361 A1* | 2/2013 | Yamashita | H01L 23/49822 | 174/260 |
| 2013/0074332 A1* | 3/2013 | Suzuki | H05K 1/185 | 29/834 |
| 2013/0081870 A1* | 4/2013 | Furutani | H05K 3/445 | 174/262 |
| 2013/0192884 A1* | 8/2013 | Furutani | H05K 1/185 | 174/258 |
| 2013/0223033 A1* | 8/2013 | Mano | H01F 17/0013 | 361/763 |
| 2013/0256007 A1* | 10/2013 | Furutani | H05K 1/185 | 174/255 |
| 2013/0284506 A1* | 10/2013 | Zanma | H05K 1/115 | 174/260 |
| 2014/0090881 A1* | 4/2014 | Shin | H05K 1/185 | 174/260 |
| 2014/0166343 A1* | 6/2014 | Kim | H05K 1/185 | 174/251 |
| 2014/0182897 A1* | 7/2014 | Lee | H05K 3/002 | 174/251 |
| 2014/0353017 A1* | 12/2014 | Noda | H05K 1/185 | 174/257 |
| 2015/0041053 A1* | 2/2015 | Kiwanami | H05K 3/0097 | 156/247 |

\* cited by examiner

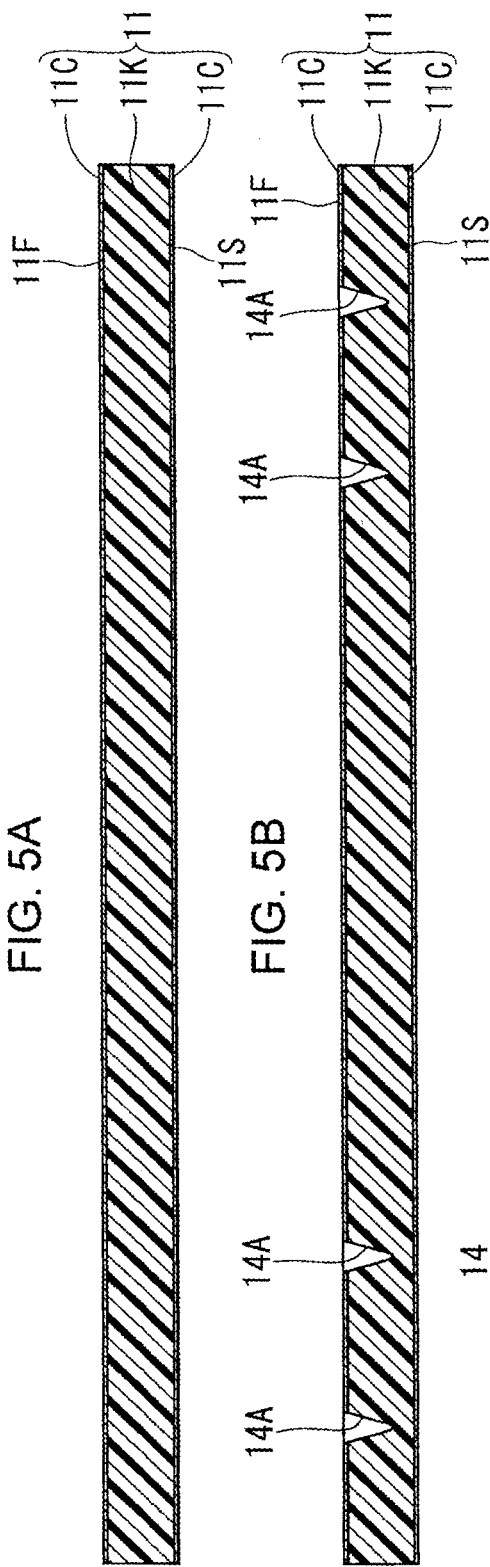

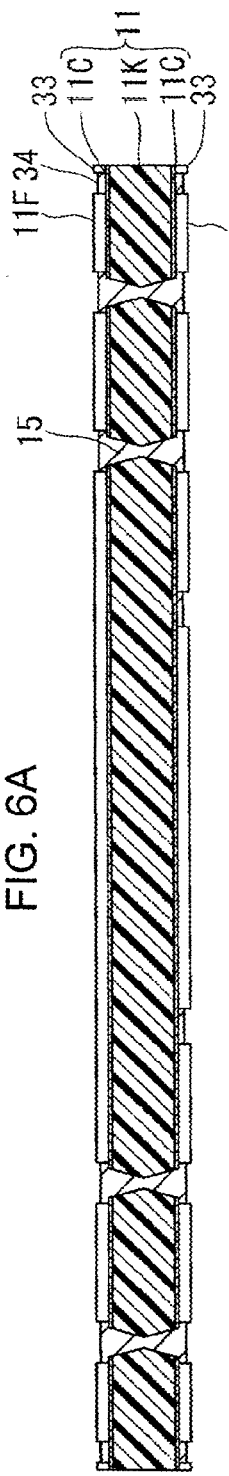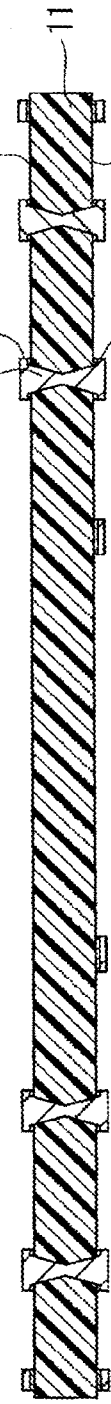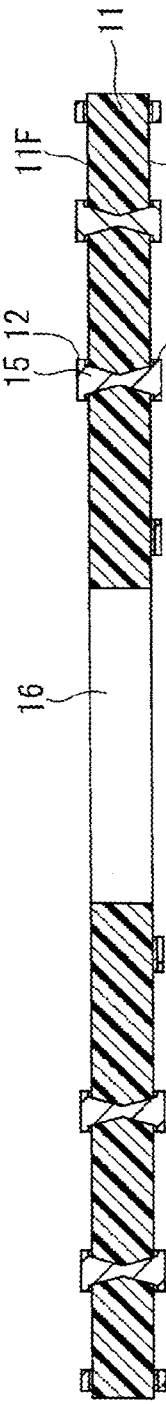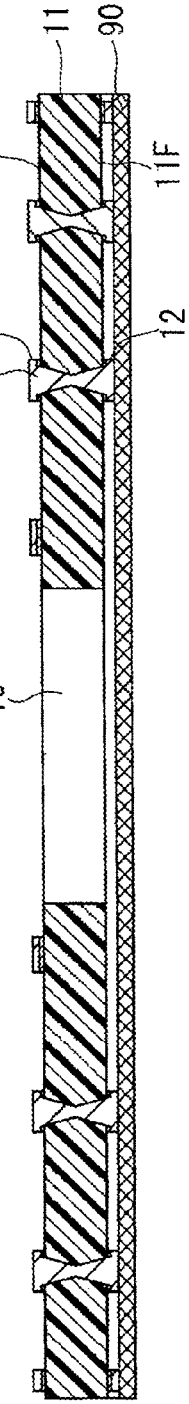

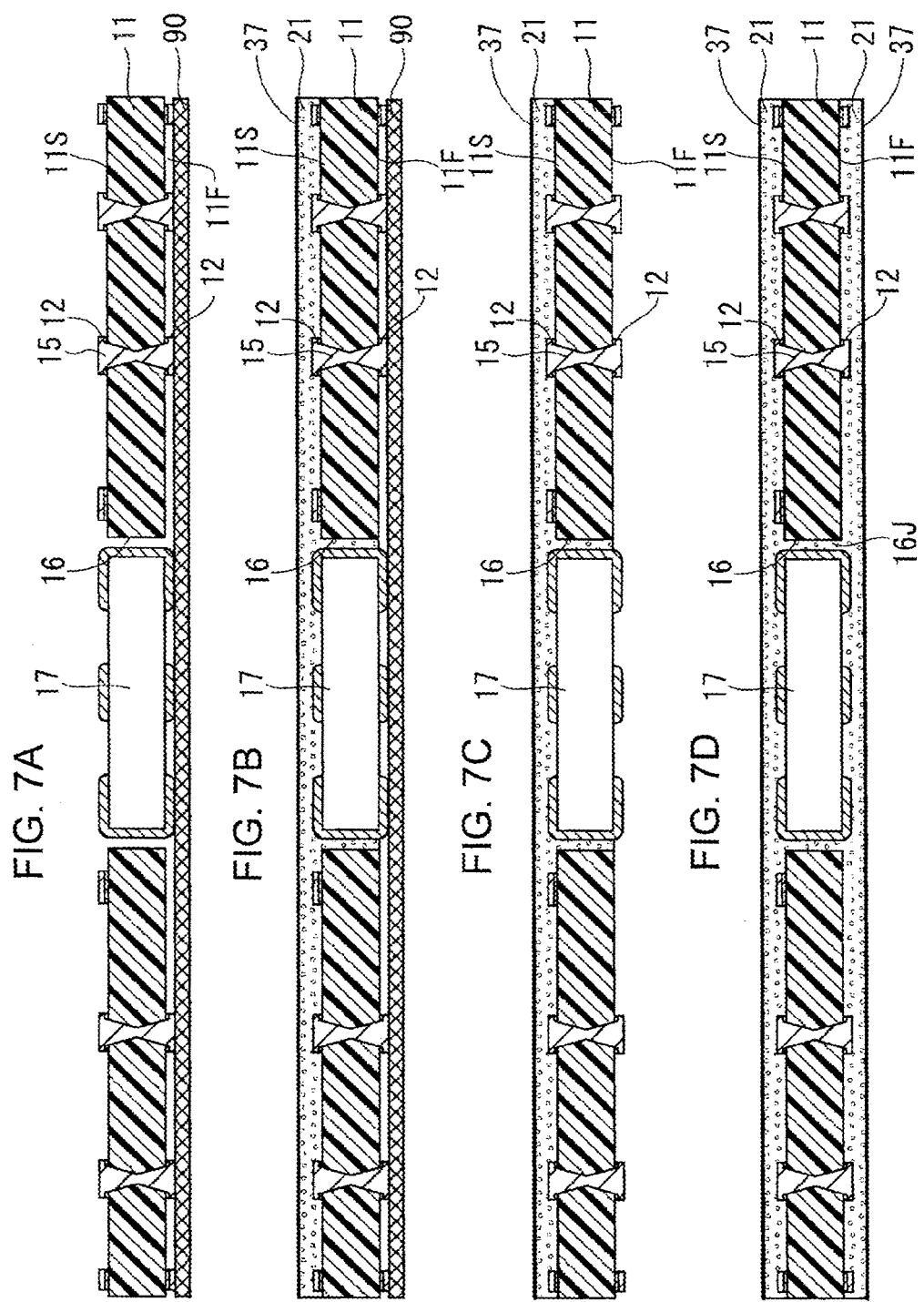

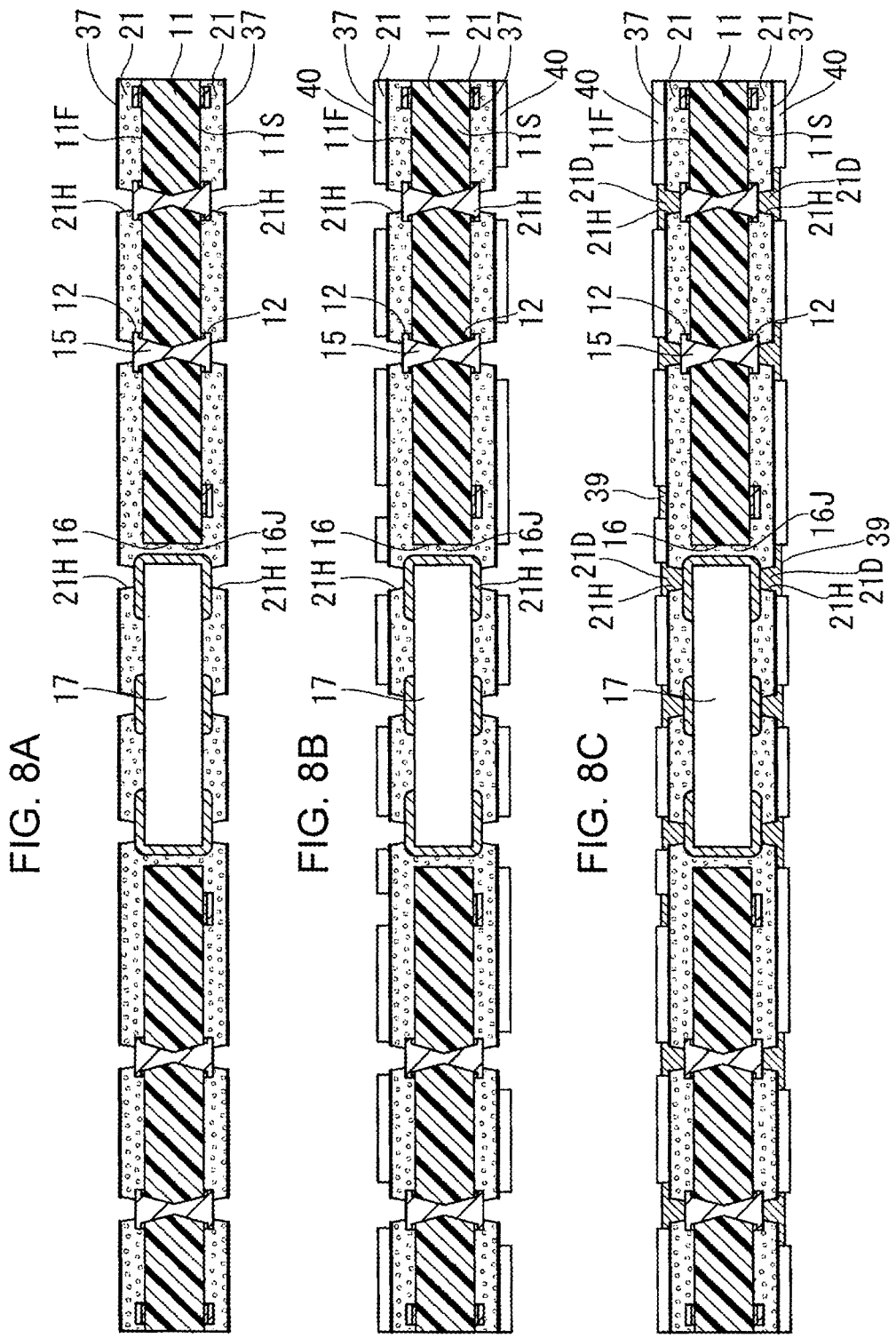

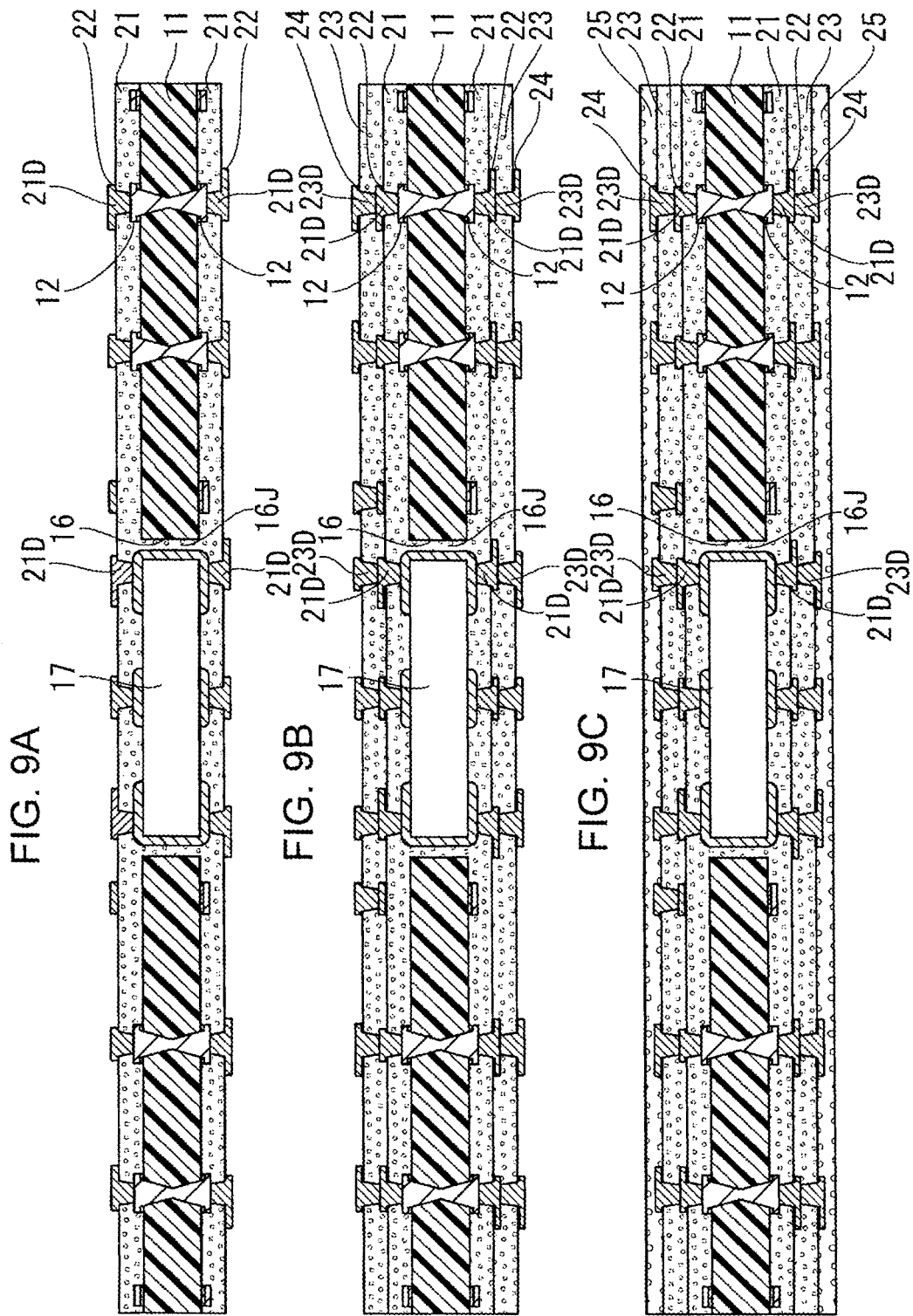

WIRING BOARD WITH BUILT-IN ELECTRONIC COMPONENT AND METHOD FOR MANUFACTURING THE SAME

CROSS-REFERENCE TO RELATED APPLICATIONS

The present application is based upon and claims the benefit of priority to Japanese Patent Application No. 2014-207433, filed Oct. 8, 2014, the entire contents of which are incorporated herein by reference.

BACKGROUND OF THE INVENTION

Field of the Invention

The present invention relates to a wiring board with a built-in electronic component, in which an electronic component that is formed in a shape of a rectangular cuboid and has metal film-like terminal electrodes on its outer surface is accommodated in a cavity, and relates to a method for manufacturing the wiring board with a built-in electronic component.

Description of Background Art

Japanese Patent Laid-Open Publication No. 2009-004734 describes an electronic component in which terminal electrodes are provided and are arranged in a form of a matrix on an outer surface of the electronic component such that polarities of terminal electrodes that are adjacent to each other in a row direction and in a column direction are opposite to each other. The entire contents of this publication are incorporated herein by reference.

SUMMARY OF THE INVENTION

According to one aspect of the present invention, a wiring board with a built-in electronic component includes a substrate having a cavity, an interlayer insulating layer formed on the substrate such that the interlayer insulating layer is covering the cavity of the substrate, a conductor layer formed on the interlayer insulating layer, and an electronic component accommodated in the cavity of the substrate and including a rectangular cuboid body and terminal electrodes such that each of the terminal electrodes has a metal film form formed on an outer surface of the rectangular cuboid body, and via conductors formed in the interlayer insulating layer such that the via conductors are connecting the conductor layer and the terminal electrodes of the electronic component. The electronic component has the terminal electrodes arrayed in a matrix having rows and columns on the outer surface of the rectangular cuboid body such that adjacent terminal electrodes in a row direction and in a column direction have the opposite polarities, and the conductor layer includes a line pattern shunting a first group of the terminal electrodes in one polarity and a solid pattern shunting a second group of the terminal electrodes in the other polarity such that the solid pattern is insulated from the line pattern.

According to another aspect of the present invention, a method for manufacturing a wiring board with a built-in electronic component includes forming a cavity in a substrate, positioning in the cavity of the substrate an electronic component including a rectangular cuboid body and terminal electrodes such that each of the terminal electrodes has a metal film form formed on an outer surface of the rectangular cuboid body, forming an interlayer insulating layer on the substrate such that the interlayer insulating layer covers the cavity of the substrate, forming a conductor layer on the interlayer insulating layer, and forming via conductors formed in the interlayer insulating layer such that the via conductors are connecting the conductor layer and the terminal electrodes of the electronic component. The electronic component has the terminal electrodes arrayed in a matrix having rows and columns on the outer surface of the rectangular cuboid body such that adjacent terminal electrodes in a row direction and in a column direction have the opposite polarities, and the forming of the conductor layer includes forming a line pattern shunting a first group of the terminal electrodes in one polarity and forming a solid pattern shunting a second group of the terminal electrodes in the other polarity such that the solid pattern is insulated from the line pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5A-5D are cross-sectional side views illustrating processes for manufacturing a wiring board with a built-in electronic component;

FIG. 6A-6D are cross-sectional side views illustrating processes for manufacturing a wiring board with a built-in electronic component;

FIG. 7A-7D are cross-sectional side views illustrating processes for manufacturing a wiring board with a built-in electronic component;

FIG. 8A-8C are cross-sectional side views illustrating processes for manufacturing a wiring board with a built-in electronic component;

FIG. 9A-9C are cross-sectional side views illustrating processes for manufacturing a wiring board with a built-in electronic component;

DETAILED DESCRIPTION OF THE EMBODIMENTS

Figure 1:
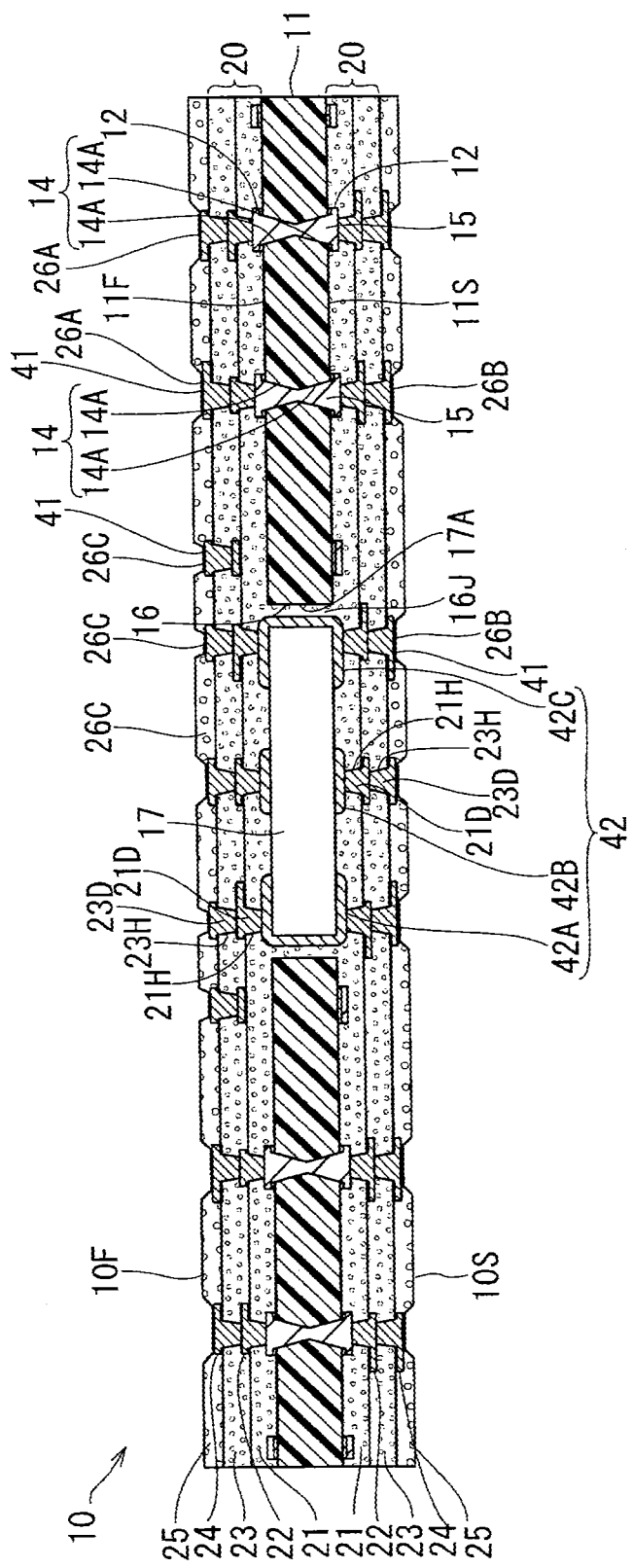
FIG. 1 is a cross-sectional side view of a wiring board with a built-in electronic component according to a first embodiment of the present invention.

The embodiments will now be described with reference to the accompanying drawings, wherein like reference numerals designate corresponding or identical elements throughout the various drawings.

First Embodiment

In the following, a first embodiment of the present invention is described based on FIG. 1-11. As illustrated in FIG.

1, in a wiring board 10 with a built-in electronic component of the present embodiment, build-up layers (20, 20) are respectively laminated on both front and back surfaces of a core substrate 11 (corresponding to a "substrate" according to an embodiment of the present invention). In the core substrate 11, a cavity 16 is formed penetrating through the core substrate 11. A multilayer ceramic capacitor 17 (hereinafter, referred to as a "MLCC 17") as an electronic component is accommodated in the cavity 16.

Figure 2:
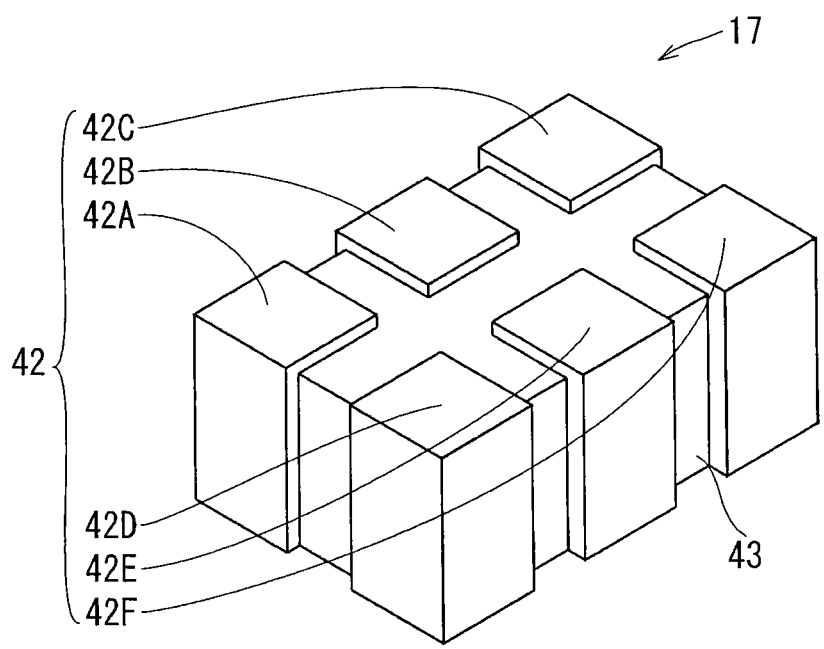
FIG. 2 is a perspective view of an MLCC.
Figure 3A:
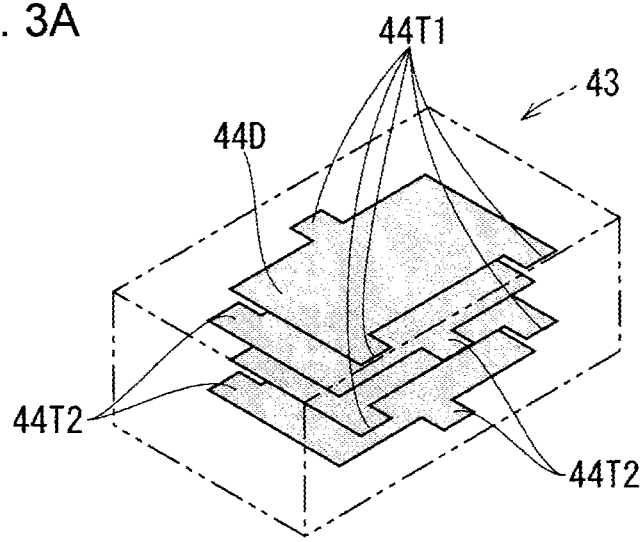
FIGS. 3A and 3B are conceptual diagrams of the MLCC.
Figure 3B:
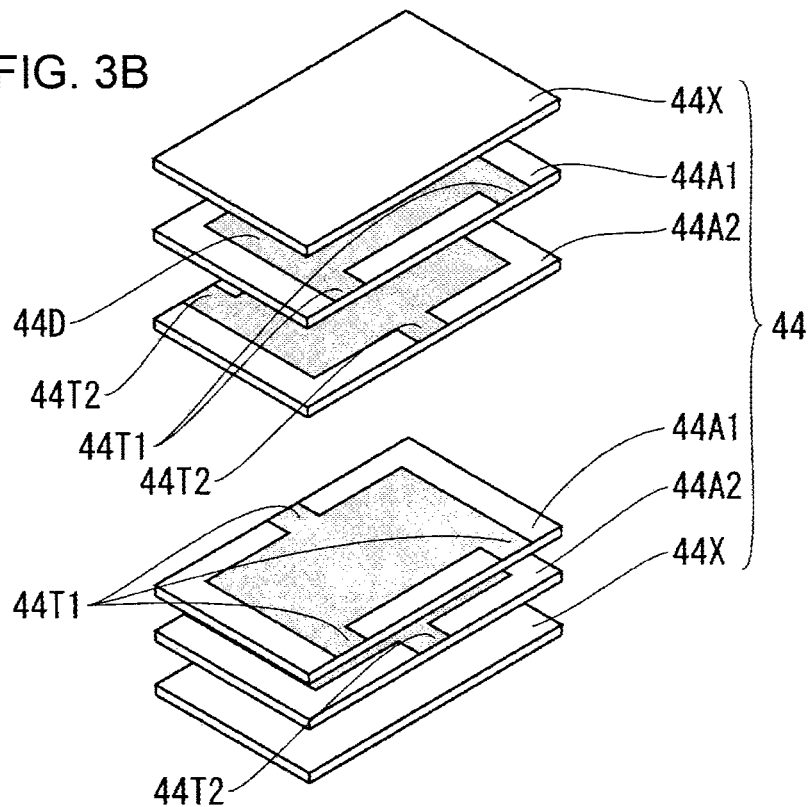

As illustrated in FIG. 2, the MLCC 17 has six metal film-like terminal electrodes 42 that cover an outer surface of the MLCC 17. Specifically, for example, as illustrated in FIG. 3B, an element body 43 of the MLCC 17 excluding the terminal electrodes 42 is formed by laminating multiple rectangular ceramic sheets 44 and has a shape of a rectangular cuboid that has a rectangular planar shape. The ceramic sheets 44 include internal electrode sheets (44A) (on one side of each of which an internal electrode (44D) is printed) and outer covering sheets (44X) (on each of which an internal electrode (44D) is not printed). Further, the internal electrode sheets (44A) are divided into first internal electrode sheets (44A1) for negative electrodes and second internal electrode sheets (44A2) for positive electrodes.

The first internal electrode sheets (44A1) for negative electrodes each have a structure that has three first side-surface electrodes (44T1) that are respectively formed by extending the internal electrode (44D) at two end parts of a long-side outer edge part on a front side in FIG. 3B, among a pair of long-side outer edge parts of the ceramic sheet 44, and at a central part of a long-side outer edge part on an opposite side of the front side. On the other hand, the second internal electrode sheets (44A2) for positive electrodes each have a structure that has three second side-surface electrodes (44T2) that are respectively formed by extending the internal electrode (44D) at a central part of a long-side outer edge part on a front side in FIG. 3B, among a pair of long-side outer edge parts of the ceramic sheet 44, and at two end parts of a long-side outer edge part on an opposite side of the front side.

The first internal electrode sheets (44A1) and the second internal electrode sheets (44A2) are alternately laminated, and are sandwiched by the outer covering sheets (44X, 44X). Thereby, the element body 43 is formed. As a result, in the element body 43, on a long-side side surface on the front side in FIG. 3A, a group of first side-surface electrodes (44T1) of negative electrodes is arrayed on each of two end parts in a lateral direction and a group of second side-surface electrodes (44T2) of positive electrodes is arrayed on a central part in the lateral direction. Further, on an long-side side surface on the opposite side of the front side, a group of second side-surface electrodes (44T2) of positive electrodes is arrayed on each of two end parts in the lateral direction and a group of first side-surface electrodes (44T1) of negative electrodes is arrayed on a central part in the lateral direction. That is, on the pair of opposing side surfaces of the element body 43, a total of six side-surface electrode groups, three on each side, are provided. As illustrated in FIG. 2, the six side-surface electrode groups are connected to the six terminal electrodes 42 that cover an outer surface of the element body 43.

The terminal electrodes 42 each have a structure in which a side surface on a long-side side of the element body 43 extends along a lamination direction of the ceramic sheets 44 is bent to two upper and lower surfaces of the terminal electrode 42. Further, the terminal electrodes 42 that are connected to the side-surface electrode groups on the two end parts in the lateral direction on the long-side side surfaces of the element body 43 each have a structure that also bends to a short-side side surface of the element body 43 and covers a corner part of the element body 43. As a result, a structure is achieved in which, on both upper and lower surfaces of the MLCC 17, the terminal electrodes 42 are arrayed in a form of a matrix of two rows and three columns and terminal electrodes 42 that are adjacent to each other in both a row direction and a column direction have opposite polarities. Specifically, as illustrated in FIG. 2, on the upper surface of the MLCC 17, in a first row along one long-side outer edge part, a terminal electrode (42A) of a negative electrode, a terminal electrode (42B) of a positive electrode and a terminal electrode (42C) of a negative electrode are arrayed that each have quadrangular shape; and in a second row along the other long-side outer edge part, a terminal electrode (42D) of a positive electrode, a terminal electrode (42E) of a negative electrode and a terminal electrode (42F) of a positive electrode are arrayed that each have a quadrangular shape. Further, on the lower surface of the MLCC 17, the positive and negative terminal electrodes (42A-42F) are arrayed in the same manner.

In the following description, the terminal electrodes (42A, 42C, 42E) of negative electrodes are referred to as the "negative terminal electrodes (42A, 42C, 42E)," and the terminal electrodes (42B, 42D, 42F) of positive electrodes are referred as the "positive terminal electrodes (42B, 42D, 42F)." Further, when the negative terminal electrodes (42A, 42C, 42E) and the positive terminal electrodes (42B, 42D, 42F) are described without distinguishing, they are simply referred as the "terminal electrodes 42."

The core substrate 11 illustrated in FIG. 1 is formed using an insulating member. A conductor circuit layer 12 is formed on each of an F surface (11F), which is the front side surface of the core substrate 11, and an S surface (11S), which is the back side surface of the core substrate 11. Further, in the core substrate 11, multiple cavities 16 are formed and, separately from the cavities 16, electrical conduction through holes 14 are formed.

An MLCC 17 is accommodated in each of the cavities 16 of the core substrate 11. For example, an upper surface of the MLCC 17 is positioned on the F surface (11F) side of the core substrate 11, and a lower surface of the MLCC 17 is positioned on the S surface (11S) side of the core substrate 11. Further, the cavity 16 has a planar shape that is slightly larger than a planar shape of the entire MLCC 17 including the terminal electrodes 42. An element holding resin (16J) is filled in between the MLCC 17 and an inner side surface of the cavity 16. The MLCC 17 is positioned at a position spaced apart from the entire inner side surface of the cavity 16.

Further, a thickness of the entire MLCC 17 is slightly larger than a thickness of the core substrate 11. An outermost surface of the conductor circuit layer 12 on the F surface (11F) side of the core substrate 11 and an outermost surface of the terminal electrodes 42 on a front side surface of the MLCC 17 are substantially flush with each other; and an outermost surface of the conductor circuit layer 12 on the S surface (11S) side of the core substrate 11 and an outermost surface of the terminal electrodes 42 on a back side surface of the MLCC 17 are substantially flush with each other.

The electrical conduction through holes 14 are each formed in a middle-constricted shape in which small diameter side ends of tapered holes (14A, 14A) are communicatively connected, the tapered holes (14A, 14A) being respective formed by drilling from the F surface (11F) and the S surface (11S) of the core substrate 11 and being gradually reduced in diameter toward a deep side. The electrical conduction through holes 14 are filled with plating and through-hole electrical conductors 15 are respectively formed. The conductor circuit layer 12 on the F surface (11F) and the conductor circuit layer 12 on the S surface (11S) are connected by the through-hole electrical conductors 15.

Both the build-up layer 20 on the F surface (11F) side of the core substrate 11 and the build-up layer 20 on the S surface (11S) side of the core substrate 11 are formed by sequentially laminating, from the core substrate 11 side, a first insulating resin layer 21 (corresponding to an "interlayer insulating layer" according to an embodiment of the present invention), a first conductor layer 22 (corresponding to an "conductor layer" according to an embodiment of the present invention), a second insulating resin layer 23 and a second conductor layer 24. A solder resist layer 25 is laminated on the second conductor layer 24.

Via holes (21H) and via holes (23H) are respectively formed in the first insulating resin layer 21 and the second insulating resin layer 23. The via holes (21H, 23H) are all formed in a tapered shape that is gradually reduced in diameter toward the core substrate 11 side. The via holes (21H, 23H) are filled with plating and via conductors (21D, 23D) are formed. Then, the conductor circuit layer 12 and the first conductor layer 22, and, the MLCC 17 and the first conductor layer 22, are connected by the via conductors (21D) of the first insulating resin layer 21; and the first conductor layer 22 and the second conductor layer 24 are connected by the via conductors (23D) of the second insulating resin layer 23.

For some of the MLCCs 17 that are accommodated in the cavities 16 of the core substrate 11, as described below, all of the negative terminal electrodes (42A, 42C, 42E) are commonly connected to a solid pattern 51, and the positive terminal electrodes (42B, 42D, 42F) are commonly connected to a line pattern 50. For the other MLCCs 17, one or both of the negative terminal electrodes (42A, 42C, 42E) and the positive terminal electrodes (42B, 42D, 42F) are separately connected to connection target line patterns.

Figure 4:
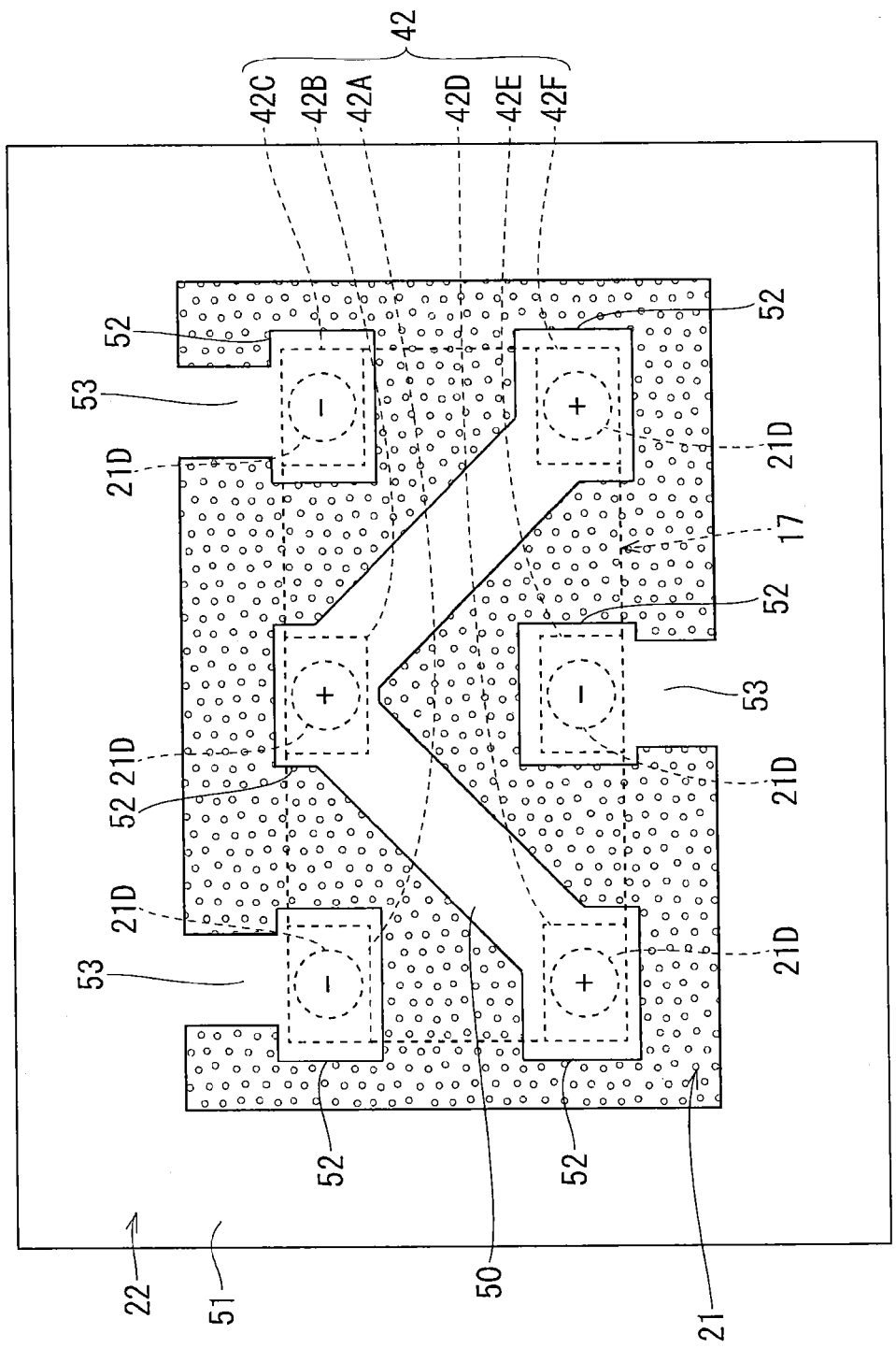
FIG. 4 is a plan view of the MLCC.

Specifically, description about some of the MLCCs 17 is as follows. That is, as illustrated in FIG. 4, in each of the front and back first conductor layers 22 of the core substrate 11, electrode opposing parts 52 are provided and are arrayed in two rows and three columns corresponding to the terminal electrodes 42 that are arrayed in two rows and three columns on each of both upper and lower surfaces of the MLCC 17. A terminal electrode 42 and a corresponding electrode opposing part 52 are connected to each other by a via conductor (21D). Further, in the first conductor layer 22, the frame-shaped solid pattern 51 is provided surrounding a projection region of the cavity 16. The electrode opposing parts 52 corresponding to the negative terminal electrodes (42A, 42C, 42E) and an inner edge part of the solid pattern 51 are connected by extension parts 53. Further, the electrode opposing parts 52 corresponding to the positive terminal electrode (42B) at the center of the first row of the MLCC 17 and the electrode opposing parts (52, 52) corresponding to the positive terminal electrodes (42D, 42F) at the two ends of the second row are linearly connected by the line pattern 50 provided in the first conductor layer 22. That is, the positive terminal electrodes (42B, 42D, 42F) are connected by the triangle wave-shaped line pattern 50.

Pad holes are formed in the solder resist layer 25, and a portion of the second conductor layer 24 positioned in each of the pad holes becomes a pad. On an F surface (10F), which is a front side surface of the entire wiring board 10 with a built-in electronic component, pads are formed including a group of large pads (26A) and a group of small pads (26C). The group of the small pads (26C) are arrayed in a form of a matrix, and the group of the large pads (26A) are arrayed in a form of a frame surrounding the group of the small pads (26C). On the other hand, pads on an S surface (10S), which is a back side surface of the entire wiring board 10 with a built-in electronic component, are formed as medium pads (26B) that are larger than the small pads (26C).

The wiring board 10 with a built-in electronic component of the present embodiment is manufactured as follows.

(1) As illustrated in FIG. 5A, a substrate as the core substrate 11 is prepared that is obtained by laminating a copper foil (11C) on each of both front and back surfaces of an insulating base material (11K) that is made of epoxy resin or BT (bismaleimide triazine) resin and a reinforcing material such as a glass cloth.

(2) As illustrated in FIG. 5B, the tapered holes (14A) for forming the electrical conduction through holes 14 (see FIG. 1) are drilled by irradiating, for example, CO2 laser to the core substrate 11 from the F surface (11F) side.

(3) As illustrated in FIG. 5C, the tapered holes (14A) are drilled on the S surface (11S) side of the core substrate 11 by irradiating CO2 laser to positions directly on the back of the above-described tapered holes (14A) on the F surface (11F) side. The electrical conduction through holes 14 are formed from the tapered holes (14A, 14A).

(4) An electroless plating treatment is performed. An electroless plating film (not illustrated in the drawings) is formed on the copper foil (11C) and on inner surfaces of the electrical conduction through holes 14.

(5) As illustrated in FIG. 5D, a plating resist 33 of a predetermined pattern is formed on the electroless plating film on the copper foil (11C).

(6) An electrolytic plating treatment is performed. As illustrated in FIG. 6A, the electrical conduction through holes 14 are filled with electrolytic plating and the through-hole electrical conductors 15 are formed; and an electrolytic plating film 34 is formed on a portion of the electroless plating film (not illustrated in the drawings) on the copper foil (11C), the portion being exposed from the plating resist 33.

(7) The plating resist 33 is peeled off, and the electroless plating film (not illustrated in the drawings) and the copper foil (11C), which are below the plating resist 33, are removed. As illustrated in FIG. 6B, by the remaining electrolytic plating film 34, electroless plating film and copper foil (11C), the conductor circuit layer 12 is formed on the F surface (11F) of the core substrate 11, and the conductor circuit layer 12 is formed on the S surface (11S) of the core substrate 11. Then, the conductor circuit layer 12 on the F surface (11F) and the conductor circuit layer 12 on the S surface (11S) are in a state of being connected by the through-hole electrical conductors 15.

(8) As illustrated in FIG. 6C, the cavity 16 is formed in the core substrate 11 using a router or CO2 laser.

(9) As illustrated in FIG. 6D, a tape 90 made of a PET film is affixed to the F surface (11F) of the core substrate 11 so as to close the cavity 16.

(10) The MLCC 17 is prepared.

(11) As illustrated in FIG. 7A, the MLCC 17 is accommodated in the cavity 16 using a mounter (not illustrated in the drawings).

(12) As illustrated in FIG. 7B, a prepreg (a resin sheet of a B-stage formed by impregnating a core material with resin) as the first insulating resin layer 21 and a copper foil 37 are laminated on the conductor circuit layer 12 on the S surface (11S) of the core substrate 11, and then, the resulting substrate is hot-pressed. In doing so, spacing between the conductor circuit layers (12, 12) on the S surface (11S) of the core substrate 11 is filled with the prepreg, and a gap between the inner surface of the cavity 16 and the MLCC 17 is filled with thermosetting resin exuded from the prepreg.

(13) As illustrated in FIG. 7C, the tape 90 is removed.

(14) As illustrated in FIG. 7D, a prepreg as the first insulating resin layer 21 and a copper foil 37 are laminated on the conductor circuit layer 12 on the F surface (11F) of the core substrate 11, and then, the resulting substrate is hot-pressed. In doing so, spacing between the conductor circuit layers (12, 12) on the F surface (11F) of the core substrate 11 is filled with the prepreg, and a gap between an inner surface of the cavity 16 and the MLCC 17 is filled with thermosetting resin exuded from the prepreg. Further, the above-described element holding resin (16J) is formed by the thermosetting resin that exudes from the prepregs on the F surface (11F) and the S surface (11S) of the core substrate 11 and is filled in the gap between the inner surface of the cavity 16 and the MLCC 17.

Instead of the prepreg, it is also possible to use a resin film that does not contain a core material as the first insulating resin layer 21. In this case, without laminating a copper foil, a conductor circuit layer can be directly formed on a surface of the resin film using a semi-additive method.

(15) As illustrated in FIG. 8A, the via holes (21H) are formed by irradiating CO2 laser to the first insulating resin layers (21, 21) that are respectively formed on the front and back sides of the core substrate 11 by the prepregs. Among the via holes (21H), some via holes (21H) are positioned on the conductor circuit layers 12 and other via holes (21H) are positioned on the MLCC 17.

(16) An electroless plating treatment is performed. Electroless plating films (not illustrated in the drawings) are formed on the first insulating resin layers (21, 21) and in the via holes (21H, 21H).

(17) As illustrated in FIG. 8B, plating resists 40 of predetermined patterns are respectively formed on the electroless plating films on the copper foils 37.

(18) An electrolytic plating treatment is performed. As illustrated in FIG. 8C, the via holes (21H, 21H) are filled with plating and the via conductors (21D, 21D) are formed. Further, electrolytic plating films (39, 39) are formed on portions of the electroless plating films (not illustrated in the drawings) on the first insulating resin layers (21, 21), the portions being exposed from the plating resists 40.

(19) The plating resists 40 are removed, and the electroless plating films (not illustrated in the drawings) and the copper foils 37, which are below the plating resists 40, are removed. As illustrated in FIG. 9A, the first conductor layers 22 are respectively formed on the first insulating resin layers 21 on the front and back sides of the core substrate 11 by the remaining electrolytic plating films 39, electroless plating films and copper foils 37. Then, a state is achieved in which, on each of the front and back sides of the core substrate 11, a portion of the first conductor layer 22 and the conductor circuit layer 12 are connected by the via conductors (21D), and the other portion of the first conductor layer 22 and the MLCC 17 are connected by the via conductors (21D).

(20) By the same processing as described in the above (12)-(19), as illustrated in FIG. 9B, a state is achieved in which, on each of the front and back sides of the core substrate 11, the second insulating resin layer 23 and the second conductor layer 24 are formed on the first conductor layer 22, and a portion of the second conductor layer 24 and the first conductor layer 22 are connected by the via conductors (23D).

(21) As illustrated in FIG. 9C, the solder resist layers (25, 25) are respectively laminated on the second conductor layers 24 on the front and back sides of the core substrate 11.

Figure 10:
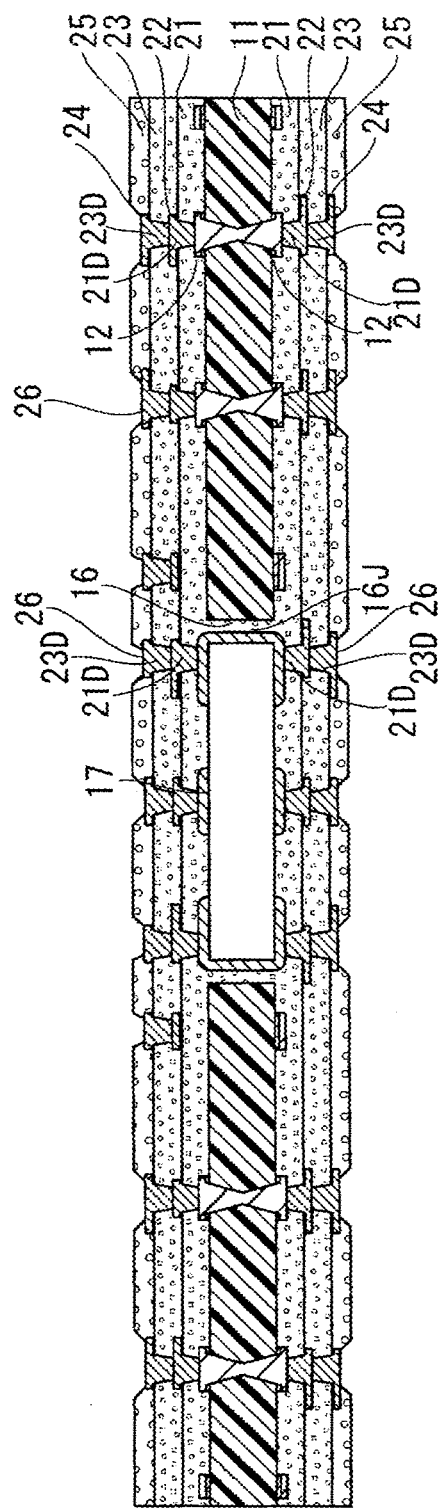
FIG. 10 is a cross-sectional side view illustrating a process for manufacturing a wiring board with a built-in electronic component.

(22) As illustrated in FIG. 10, tapered pad holes are formed at predetermined places on the solder resist layers (25, 25) on the front and back sides of the core substrate 11, and portions of the second conductor layers 24 on the front and back sides of the core substrate 11 that are exposed from the pad holes become the pads 26.

(23) On each of the pads 26, a nickel layer, a palladium layer and a gold layer are laminated in this order and a metal film 41 illustrated in FIG. 1 is formed. As a result, the wiring board 10 with a built-in electronic component is completed.

Figure 11:
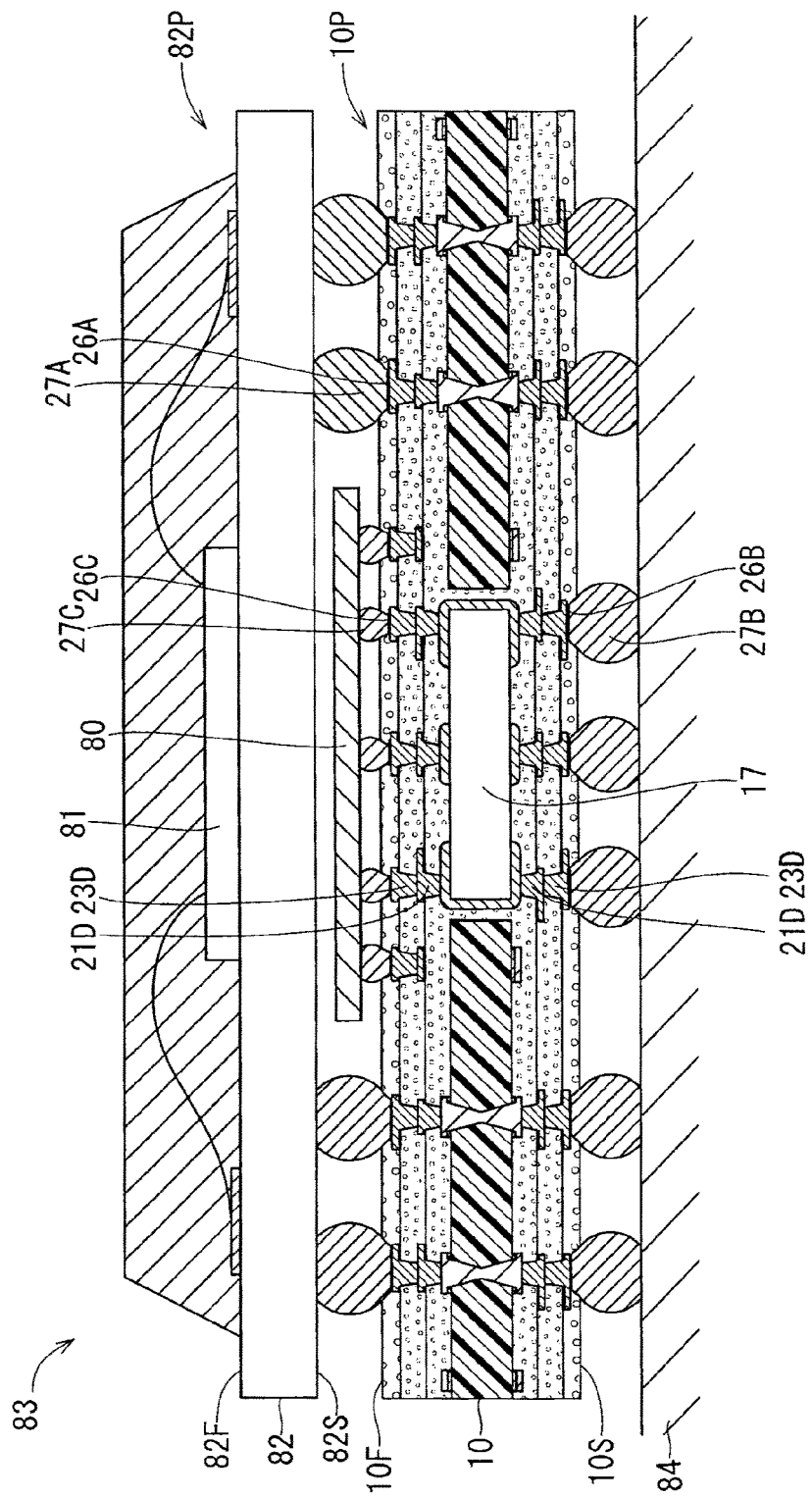
FIG. 11 is a cross-sectional side view of a PoP that includes a wiring board with a built-in electronic component.

The description about the structure and the manufacturing method of the wiring board 10 with a built-in electronic component of the present embodiment is as given above. Next, an operation effect of the wiring board 10 with a built-in electronic component, together with an example of use of the wiring board 10 with a built-in electronic component, is described. The wiring board 10 with a built-in electronic component of the present embodiment is used, for example, as follows. That is, as illustrated in FIG. 11, large, medium and small solder bumps (27A, 27B, 27C) that respectively match the sizes of the above-described large, medium and small pads (26A, 26B, 26C) of the wiring board 10 with a built-in electronic component are respectively formed on the large, medium and small pads (26A, 26B, 26C). Then, for example, a CPU 80 having on a lower surface a group of pads that are positioned in the same way as the group of the small pads of the F surface (10F) of the wiring board 10 with a built-in electronic component is mounted on and is soldered to the group of the small solder bumps (27C) of each product region (R2), and a first package substrate (10P) is formed. Here, the pads of the CPU 80 are connected to the MLCC 17 via the via conductors (21D, 23D).

Next, a second package substrate (82P) that is obtained by mounting a memory 81 on an F surface (82F) of a circuit substrate 82 is positioned from an upper side of the CPU 80 on the first package substrate (10P). The large solder bumps (27A) of the wiring board 10 with a built-in electronic component of the first package substrate (10P) are soldered to pads that are provided on an S surface (82S) of the circuit substrate 82 of the second package substrate (82P), and thereby a PoP 83 (Package on Package 83) is formed. Spacing between the wiring board 10 with a built-in electronic component and the circuit substrate 82 in the PoP 83 is filled with resin (not illustrated in the drawings).

Next, the PoP 83 is positioned on a motherboard 84. The medium solder bumps (27B) of the wiring board 10 with a built-in electronic component of the PoP 83 are soldered to a group of pads of the motherboard 84. As a result, a circuit is structured having multiple MLCCs 17 built in the wiring board 10 with built-in electronic components.

Here, the MLCCs 17 that are built in the wiring board 10 with a built-in electronic component each have six positive or negative terminal electrodes 42 that are arrayed in a form of a matrix of two rows and three columns. Therefore, in a circuit of the wiring board 10 with a built-in electronic component, a degree of freedom in positioning of ESL and ESR of the MLCCs 17 is increased. As a result, the MLCC 17 can be connected such that power supplied to the circuit or power loss in accordance with a signal frequency is reduced. Further, the cavity 16 penetrate through the core substrate 11, and the MLCC 17 accommodated in the cavity 16 is provided with the terminal electrodes 42 on both front and back surfaces of the MLCC 17. Therefore, the MLCC 17 can be connected to circuits on the front and back sides of the core substrate 11 in short distances, ESL and ESR of an entire circuit of the wiring board 10 with a built-in electronic component including the MLCC 17 can be suppressed, and power loss can be reduced.

Then, in each of the some of the MLCCs 17 having the same six-pole structure that are used as bipolar MLCCs 17, by providing, in the first conductor layer 22, the line pattern 50 that shunts terminal electrodes 42 of one polarity (specifically, the negative terminal electrodes (42A, 42C, 42E)) of the MLCC 17 and the solid pattern 51 that shunts terminal electrodes 42 of the other polarity (specifically, the positive terminal electrodes (42B, 42D, 42F)), the six terminal electrodes 42 can be gathered into two electrodes by each of the front and back first conductor layers 22 of the wiring board 10 with a built-in electronic component. As a result, a circuit around the MLCC 17 can be formed compact. Further, the positive and negative terminal electrodes 42 are respectively branched into three groups and are again shunted on a circuit of the wiring board 10 with a built-in electronic component, and thereby, ESR drops to about ⅓. Further, when a configuration is adopted in which an MLCC 17 having a bipolar structure that has only two terminal electrodes 42 on an outer surface of the MLCC 17 is built in the wiring board 10 with a built-in electronic component separately from an MLCC 17 having a six-electrode structure, when the wiring board 10 with a built-in electronic component is manufactured, the two kinds of the MLCCs 17 are separately mounted, and there may be a problem that the productivity is reduced. However, such a problem does not occur.

Second Embodiment

Figure 12:
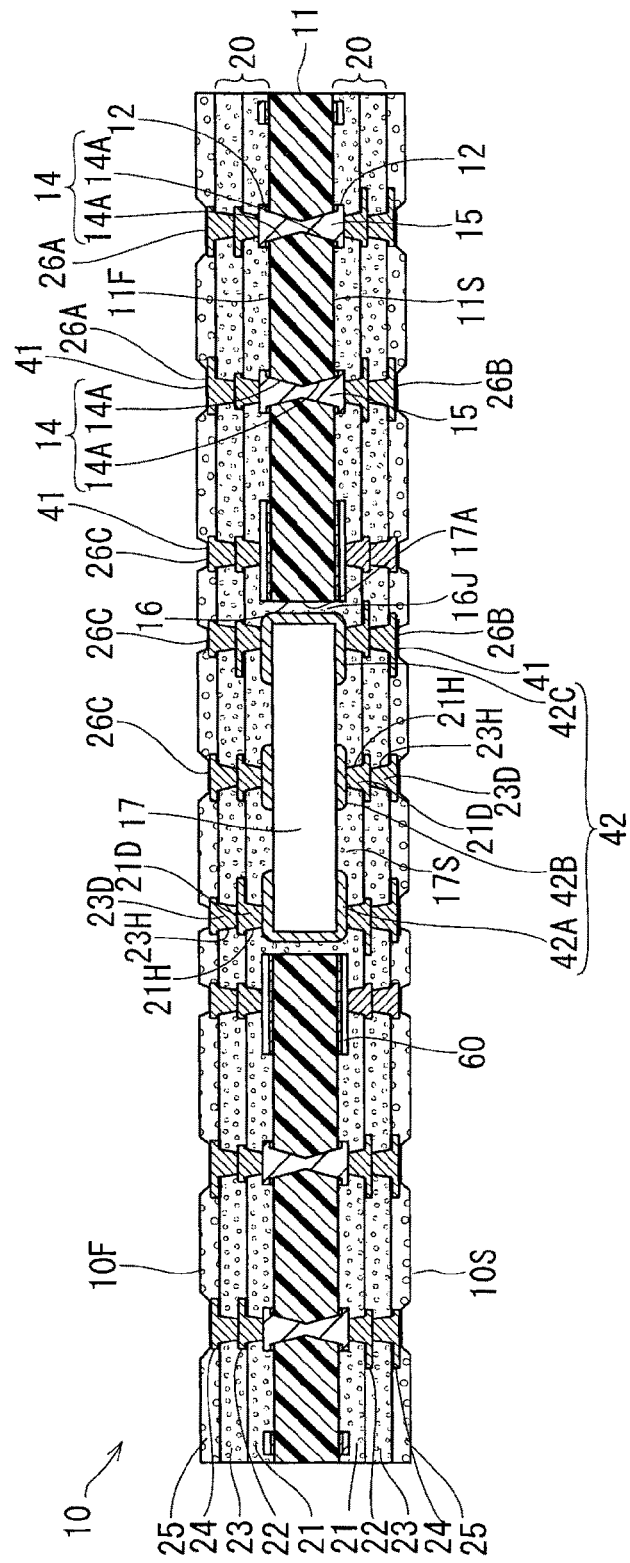
FIG. 12 is a cross-sectional side view of a wiring board with a built-in electronic component according to a second embodiment.
Figure 13:
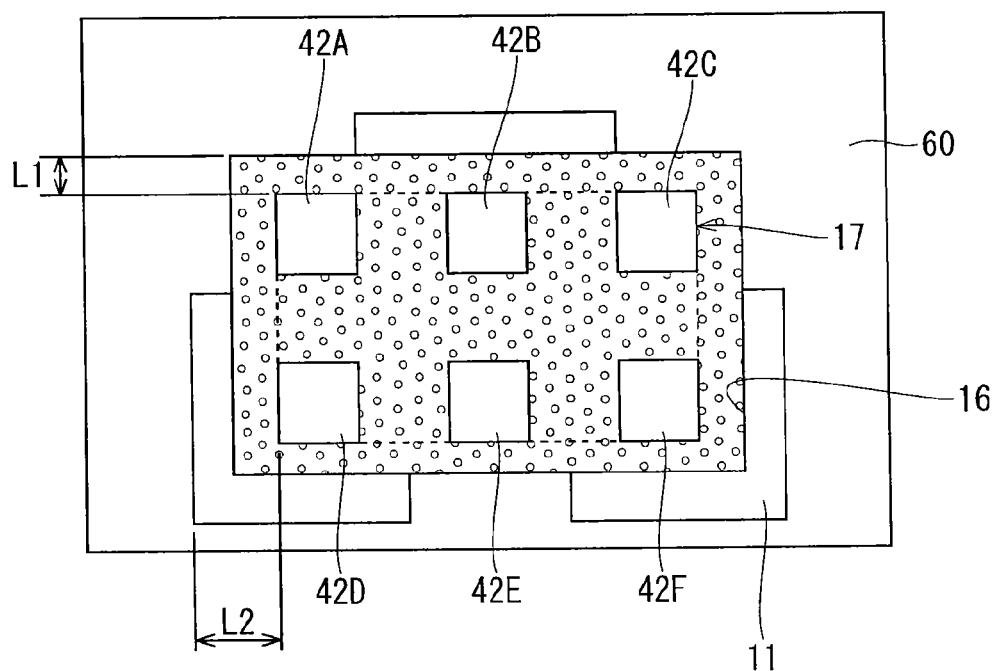
FIG. 13 is a plan cross-sectional view of a wiring board with a built-in electronic component.

FIGS. 12 and 13 illustrate a wiring board (10V) with a built-in electronic component according to a second embodiment. As illustrated in FIG. 12, in the wiring board (10V) with a built-in electronic component of the present embodiment, a frame-shaped pattern 60 is formed on each of the F surface (11F) and the S surface (11S) of the core substrate 11 so as to surround the cavity 16. The solid pattern 51 and the frame-shaped pattern 60 are connected by the via conductors (21D). The solid pattern 51 and the frame-shaped pattern 60 are grounded and used.

Further, on the F surface (11F) and the S surface (11S) of the core substrate 11, as illustrated in FIG. 13, a shortest distance (L2) between the positive terminal electrodes (42B, 42D, 42F) and an inner edge part of the frame-shaped pattern 60 is larger than a shortest distance (L1) between the negative terminal electrodes (42A, 42C, 42E) and the inner edge part of the frame-shaped pattern 60. As a result, that the positive terminal electrodes (42B, 42D, 42F) become electrically connected to the frame-shaped pattern 60 due to manufacturing variations can be prevented. Further, even when the negative terminal electrodes (42A, 42C, 42E) become electrically connected to the frame-shaped pattern 60 due to manufacturing variations, since the negative terminal electrodes (42A, 42C, 42E) are already connected to the frame-shaped pattern 60 via the first conductor layer 22 and the like and are at the same potential as the frame-shaped pattern 60, it does not cause any problem.

Other Embodiments

The present invention is not limited to the above-described embodiments. For example, embodiments described below are also included in the technical scope of the present invention. Further, in addition to the embodiments described below, the present invention can also be embodied in various modified forms within the scope without departing from the spirit of the present invention.

(1) In the wiring board 10 with a built-in electronic component of the first embodiment and the wiring board (10V) with a built-in electronic component of the second embodiment, the build-up layers (20, 20) are respectively laminated front and back sides of the core substrate 11. However, it is also possible to have a structure in which a build-up layer is laminated only on a surface on one of the front and back sides of the substrate.

(2) The terminal electrodes 42 of the MLCC 17 that is built in the wiring board 10 with a built-in electronic component of the first embodiment or in the wiring board (10V) with a built-in electronic component of the second embodiment are arrayed in two rows and three columns. However, it is also possible to have a structure in which terminal brackets 42 arrayed in two rows and four or more columns are provided.

(3) In the wiring board 10 with a built-in electronic component of the first embodiment and the wiring board (10V) with a built-in electronic component of the second embodiment, the MLCCs 17 that are used as bipolar MLCCs 17 are only some of the built-in MLCCs 17. However, it is also possible to have a structure in which all of the built-in MLCCs 17 are used as bipolar MLCCs 17.

An electronic component may be built in a wiring board as a built-in electronic component, and either all positive or all negative terminal electrodes may be commonly connected to a predetermined line and all other terminal electrodes may be commonly connected to another line.

However, to realize the above-described circuit structure, at least two conductor layers are laminated on a substrate having a cavity in which an electronic component is accommodated, the two conductor layers including a conductor layer in which a line is formed that shunts either all positive or all negative terminal electrodes of the electronic component, and another conductor layer in which a line is formed that shunts all the other terminal electrodes, and there is a problem that a circuit around the electronic component becomes large.

A wiring board with a built-in electronic component according to an embodiment of the present invention is capable of allowing a circuit around the electronic component to be formed compact, and another embodiment of the present invention provides a method for manufacturing such a wiring board.

A wiring board with a built-in electronic component according to an embodiment of the present invention includes: a substrate that has a cavity; an electronic component that is formed in a shape of a rectangular cuboid and has metal film-like terminal electrodes on its outer surface, and is accommodated in the cavity; a conductor layer that is laminated via an interlayer insulating layer on the substrate and on the electronic component; and via conductors that connect between the conductor layer and the terminal electrodes of the electronic component. The terminal electrodes are arrayed in a form of a matrix of two rows and three or more columns on an outer surface of the electronic component where the interlayer insulating layer is laminated, and are arrayed such that polarities of terminal electrodes that are adjacent to each other in a row direction and in a column direction are opposite to each other. In the conductor layer, a line pattern that shunts terminal electrodes of one polarity and a solid pattern that shunts terminal electrodes of the other polarity and is insulated from the line pattern are formed.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board with a built-in electronic component, comprising:
   a substrate having a cavity;
   an interlayer insulating layer formed on the substrate such that the interlayer insulating layer is covering the cavity of the substrate;
   a conductor layer formed on the interlayer insulating layer;
   an electronic component accommodated in the cavity of the substrate and comprising a rectangular cuboid body and a plurality of terminal electrodes such that each of the terminal electrodes has a metal film form formed on an outer surface of the rectangular cuboid body; and
   a plurality of via conductors formed in the interlayer insulating layer such that the plurality of via conductors is connecting the conductor layer and the terminal electrodes of the electronic component,
   wherein the electronic component has the terminal electrodes arrayed in a matrix comprising a plurality of rows and a plurality of columns on the outer surface of the rectangular cuboid body such that adjacent terminal electrodes in a row direction and in a column direction have opposite polarities, the conductor layer comprises a line pattern shunting a first group of the terminal electrodes in one polarity and a solid pattern shunting a second group of the terminal electrodes in the other polarity such that the solid pattern is insulated from the line pattern, the plurality of terminal electrodes is arrayed in the matrix comprising two rows and at least three columns on the outer surface of the rectangular cuboid body, the conductor layer comprises a plurality of electrode opposing portions arrayed in a plurality of rows facing the terminal electrodes arrayed in the matrix across the interlayer insulating layer such that the plurality of via conductors is connecting the electrode opposing portions of the conductor layer and the terminal electrodes of the electronic component, the line pattern of the conductor layer has a triangle wave line pattern facing the first group of the terminal electrodes and connecting a group of the via conductors formed in a zigzag pattern, and the solid pattern of the conductor layer has a frame pattern surrounding the electrode opposing portions and the line pattern and connecting to the second group of the terminal electrodes.

2. A wiring board with a built-in electronic component according to claim 1, further comprising:
   a second interlayer insulating layer formed on an opposite side of the substrate with respect to the interlayer insulating layer such that the interlayer insulating layer is covering the cavity of the substrate;
   a second conductor layer formed on the second interlayer insulating layer; and
   a plurality of second via conductors formed in the second interlayer insulating layer,
   wherein the substrate has the cavity penetrating through the substrate, the electronic component comprises a plurality of second terminal electrodes such that each of the second terminal electrodes has a metal film form formed on a second outer surface of the rectangular cuboid body on an opposite side with respect to the outer surface, the plurality of second via conductors is connecting the second conductor layer and the second terminal electrodes of the electronic component, the electronic component has the second terminal electrodes arrayed in a matrix comprising a plurality of rows and a plurality of columns on the second outer surface of the rectangular cuboid body such that adjacent second terminal electrodes in a row direction and in a column direction have opposite polarities, and the second conductor layer comprises a line pattern shunting a first group of the second terminal electrodes in one polarity and a solid pattern shunting a second group of the second terminal electrodes in the other polarity such that the solid pattern is insulated from the line pattern.

3. A wiring board with a built-in electronic component according to claim 1, further comprising:
   a frame-shaped conductor pattern formed on a surface of the substrate such that a shortest distance between the first group of the terminal electrodes and an inner edge of the frame-shaped conductor pattern is formed greater than a shortest distance between the second group of the terminal electrodes and the inner edge of the frame-shaped conductor pattern.

4. A wiring board with a built-in electronic component according to claim 1, wherein the solid pattern of the conductor layer is forming ground, and the line pattern of the conductor layer is forming one of a power source line and a signal line.

5. A wiring board with a built-in electronic component according to claim 1, wherein the electronic component is a multilayer ceramic capacitor.

6. A wiring board with a built-in electronic component according to claim 2, further comprising:
   a frame-shaped conductor pattern formed on a surface of the substrate such that a shortest distance between the first group of the terminal electrodes and an inner edge of the frame-shaped conductor pattern is formed greater than a shortest distance between the second group of the terminal electrodes and the inner edge of the frame-shaped conductor pattern.

7. A wiring board with a built-in electronic component according to claim 2, wherein the solid pattern of the conductor layer is forming ground, and the line pattern of the conductor layer is forming one of a power source line and a signal line.

8. A wiring board with a built-in electronic component according claim 2, wherein the electronic component is a multilayer ceramic capacitor.

9. A wiring board with a built-in electronic component according to claim 3, wherein the solid pattern of the conductor layer is forming ground, and the line pattern of the conductor layer is forming one of a power source line and a signal line.

10. A wiring board with a built-in electronic component according claim 3, wherein the electronic component is a multilayer ceramic capacitor.

11. A method for manufacturing a wiring board with a built-in electronic component, comprising:
    forming a cavity in a substrate;
    positioning in the cavity of the substrate an electronic component comprising a rectangular cuboid body and a plurality of terminal electrodes such that each of the terminal electrodes has a metal film form formed on an outer surface of the rectangular cuboid body;

forming an interlayer insulating layer on the substrate such that the interlayer insulating layer covers the cavity of the substrate;

forming a conductor layer on the interlayer insulating layer; and forming a plurality of via conductors formed in the interlayer insulating layer such that the plurality of via conductors is connecting the conductor layer and the terminal electrodes of the electronic component, wherein the electronic component has the terminal electrodes arrayed in a matrix comprising a plurality of rows and a plurality of columns on the outer surface of the rectangular cuboid body such that adjacent terminal electrodes in a row direction and in a column direction have opposite polarities, the forming of the conductor layer comprises forming a line pattern shunting a first group of the terminal electrodes in one polarity and forming a solid pattern shunting a second group of the terminal electrodes in the other polarity such that the solid pattern is insulated from the line pattern, the plurality of terminal electrodes is arrayed in the matrix comprising two rows and at least three columns on the outer surface of the rectangular cuboid body, the forming of the conductor layer comprises forming a plurality of electrode opposing portions arrayed in a plurality of rows facing the terminal electrodes arrayed in the matrix across the interlayer insulating layer such that the plurality of via conductors is connecting the electrode opposing portions of the conductor layer and the terminal electrodes of the electronic component, forming the line pattern having a triangle wave line pattern facing the first group of the terminal electrodes such that the line pattern connects a group of the via conductors formed in a zigzag pattern, and forming the solid pattern having a frame pattern surrounding the electrode opposing portions and the line pattern such that the solid pattern connects to the second group of the terminal electrodes.

12. A method for manufacturing a wiring board with a built-in electronic component according to claim 11, further comprising:

forming a second interlayer insulating layer on an opposite side of the substrate with respect to the interlayer insulating layer such that the interlayer insulating layer is covering the cavity of the substrate;

forming a second conductor layer on the second interlayer insulating layer; and forming a plurality of second via conductors in the second interlayer insulating layer, wherein the forming of the cavity comprises forming the cavity penetrating through the substrate, the electronic component comprises a plurality of second terminal electrodes such that each of the second terminal electrodes has a metal film form formed on a second outer surface of the rectangular cuboid body on an opposite side with respect to the outer surface, the plurality of second via conductors is connecting the second conductor layer and the second terminal electrodes of the electronic component, the electronic component has the second terminal electrodes arrayed in a matrix comprising a plurality of rows and a plurality of columns on the second outer surface of the rectangular cuboid body such that adjacent second terminal electrodes in a row direction and in a column direction have opposite polarities, and the forming of the second conductor layer comprises forming a line pattern shunting a first group of the second terminal electrodes in one polarity and forming a solid pattern shunting a second group of the second terminal electrodes in the other polarity such that the solid pattern is insulated from the line pattern.

13. A method for manufacturing a wiring board with a built-in electronic component according to claim 11, wherein the electronic component is a multilayer ceramic capacitor.

14. A method for manufacturing a wiring board with a built-in electronic component according to claim 11, further comprising:

forming the electronic component having the terminal electrodes arrayed in the matrix comprising the plurality of rows and the plurality of columns on the outer surface of the rectangular cuboid body such that adjacent terminal electrodes in the row direction and in the column direction have the opposite polarities.

15. A wiring board with a built-in electronic component, comprising:

a substrate having a cavity;

a frame-shaped conductor pattern formed on a surface of the substrate;

an interlayer insulating layer formed on the substrate such that the interlayer insulating layer is covering the cavity of the substrate;

a conductor layer formed on the interlayer insulating layer;

an electronic component accommodated in the cavity of the substrate and comprising a rectangular cuboid body and a plurality of terminal electrodes such that each of the terminal electrodes has a metal film form formed on an outer surface of the rectangular cuboid body; and a plurality of via conductors formed in the interlayer insulating layer such that the plurality of via conductors is connecting the conductor layer and the terminal electrodes of the electronic component, wherein the electronic component has the terminal electrodes arrayed in a matrix comprising a plurality of rows and a plurality of columns on the outer surface of the rectangular cuboid body such that adjacent terminal electrodes in a row direction and in a column direction have opposite polarities, the conductor layer comprises a line pattern shunting a first group of the terminal electrodes in one polarity and a solid pattern shunting a second group of the terminal electrodes in the other polarity such that the solid pattern is insulated from the line pattern, and the frame-shaped conductor pattern is formed on the surface of the substrate such that a shortest distance between the first group of the terminal electrodes and an inner edge of the frame-shaped conductor pattern is formed greater than a shortest distance between the second group of the terminal electrodes and the inner edge of the frame-shaped conductor pattern.

16. A wiring board with a built-in electronic component according to claim 15, further comprising:

a second interlayer insulating layer formed on an opposite side of the substrate with respect to the interlayer insulating layer such that the interlayer insulating layer is covering the cavity of the substrate;

a second conductor layer formed on the second interlayer insulating layer; and a plurality of second via conductors formed in the second interlayer insulating layer, wherein the substrate has the cavity penetrating through the substrate, the electronic component comprises a plurality of second terminal electrodes such that each of the second terminal electrodes has a metal film form formed on a second outer surface of the rectangular cuboid body on an opposite side with respect to the outer surface, the plurality of second via conductors is connecting the second conductor layer and the second terminal electrodes of the electronic component, the electronic component has the second terminal electrodes arrayed in a matrix comprising a plurality of rows and a plurality of columns on the second outer surface of the rectangular cuboid body such that adjacent second terminal electrodes in a row direction and in a column direction have opposite polarities, and the second conductor layer comprises a line pattern shunting a first group of the second terminal electrodes in one polarity and a solid pattern shunting a second group of the second terminal electrodes in the other polarity such that the solid pattern is insulated from the line pattern.

17. A wiring board with a built-in electronic component according to claim 15, wherein the solid pattern of the conductor layer is forming ground, and the line pattern of the conductor layer is forming one of a power source line and a signal line.

18. A wiring board with a built-in electronic component according to claim 15, wherein the electronic component is a multilayer ceramic capacitor.

19. A wiring board with a built-in electronic component according to claim 16, wherein the solid pattern of the conductor layer is forming ground, and the line pattern of the conductor layer is forming one of a power source line and a signal line.

20. A wiring board with a built-in electronic component according to claim 16, wherein the electronic component is a multilayer ceramic capacitor.

* * * * *